US010321567B2

(12) United States Patent
Ishikawa et al.

(10) Patent No.: US 10,321,567 B2
(45) Date of Patent: Jun. 11, 2019

(54) METHOD FOR PRODUCING ELECTRONIC COMPONENTS

(71) Applicant: HAMAMATSU PHOTONICS K.K., Hamamatsu-shi, Shizuoka (JP)

(72) Inventors: Katsuya Ishikawa, Hamamatsu (JP); Toshiyuki Kakihara, Hamamatsu (JP); Takashi Masuda, Yokohama (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 144 days.

(21) Appl. No.: 15/328,144

(22) PCT Filed: May 13, 2015

(86) PCT No.: PCT/JP2015/063806
§ 371 (c)(1),
(2) Date: Jan. 23, 2017

(87) PCT Pub. No.: WO2016/013277
PCT Pub. Date: Jan. 28, 2016

(65) Prior Publication Data
US 2017/0223829 A1 Aug. 3, 2017

(30) Foreign Application Priority Data
Jul. 24, 2014 (JP) .................. 2014-150942

(51) Int. Cl.
*H05K 1/14* (2006.01)
*H05K 1/11* (2006.01)
(Continued)

(52) U.S. Cl.
CPC ............ *H05K 1/145* (2013.01); *H05K 1/115* (2013.01); *H05K 1/144* (2013.01); *H05K 1/186* (2013.01);
(Continued)

(58) Field of Classification Search
CPC ............. H01L 21/4803; H01L 21/4857; H01L 21/4842; H01L 21/4814; H05K 1/145;
(Continued)

(56) References Cited

U.S. PATENT DOCUMENTS 7,446,262 B2 * 11/2008 Ogawa ................ H01L 21/4857
174/255
2004/0157410 A1 * 8/2004 Yamaguchi ....... H01L 23/49805
438/460
(Continued)

FOREIGN PATENT DOCUMENTS

JP  2004-221372 A  8/2004
JP  2006-261387 A  9/2006
(Continued)

OTHER PUBLICATIONS

International Preliminary Report on Patentability dated Feb. 2, 2017 for PCT/JP2015/063806.

*Primary Examiner* — Peter Dungba Vo
*Assistant Examiner* — Jeffrey T Carley
(74) *Attorney, Agent, or Firm* — Drinker Biddle & Reath LLP

(57) ABSTRACT

Through the use of a method of producing electronic components, a plurality of electronic components are obtained by cutting, along a predetermined cutting line, a laminate including a first circuit board and a second circuit board both mounted with circuit components. The method of producing electronic components includes: a stacking step of stacking the second circuit board on the first circuit board with a spacer interposed therewith, the first circuit board being provided with a filled via around a mounting region of the circuit components; a filling step of filling a filling space formed between the first circuit board and the second circuit board using the spacer with insulating resins; and a cutting step of cutting the laminate along the cutting line, the cutting
(Continued)

line dividing the filled via, and exposing the filled via from a cut surface to acquire terminal portions of the electronic components.

5 Claims, 7 Drawing Sheets

(51) Int. Cl.
    *H05K 3/00*         (2006.01)
    *H05K 3/28*         (2006.01)
    *H05K 3/30*         (2006.01)
    *H05K 3/36*         (2006.01)
    *H05K 1/18*         (2006.01)

(52) U.S. Cl.
    CPC ......... H05K 3/0052 (2013.01); H05K 3/0097 (2013.01); H05K 3/284 (2013.01); H05K 3/301 (2013.01); H05K 3/368 (2013.01); *H05K 2201/042* (2013.01); *H05K 2201/0909* (2013.01); *H05K 2203/1316* (2013.01); *H05K 2203/1327* (2013.01)

(58) Field of Classification Search
    CPC .. H05K 1/144; H05K 1/186; H05K 2201/042; H05K 2201/0909; H05K 2203/1316; H05K 2203/1327; H05K 2203/0235; H05K 3/284; H05K 3/0052; H05K 3/4611; H05K 3/4644; H05K 3/4647
    See application file for complete search history.

(56) References Cited

U.S. PATENT DOCUMENTS

| 2007/0161266 | A1* | 7/2007 | Nishizawa | H01L 24/97 439/69 |
|---|---|---|---|---|
| 2007/0221399 | A1* | 9/2007 | Nishizawa | B32B 18/00 174/250 |
| 2009/0315171 | A1* | 12/2009 | Yuan | H01L 21/486 257/697 |
| 2016/0379967 | A1* | 12/2016 | Gamini | H01L 25/18 257/659 |

FOREIGN PATENT DOCUMENTS

| JP | 2007-067246 | A | | 3/2007 |
|---|---|---|---|---|
| JP | 2007067246 | A | * | 3/2007 |
| JP | 2008-153710 | A | | 7/2008 |
| JP | 2008-311267 | A | | 12/2008 |
| JP | 2009-289936 | A | | 12/2009 |
| WO | WO-2006/035528 | A1 | | 4/2006 |

* cited by examiner

METHOD FOR PRODUCING ELECTRONIC COMPONENTS

TECHNICAL FIELD

The present invention relates to a method of producing electronic components.

BACKGROUND ART

A method of producing electronic components is described, for example, in Patent Literature 1. The electronic component described in Patent Literature 1 has a quad flat no-leads package (QFN) type terminal layout, and leads (terminals) are exposed from four sides of a rear surface of a resin package. In the method of producing electronic components described in Patent Literature 1, the electronic component is obtained by performing resin molding on a lead frame to form a part corresponding to the resin package and then cutting and dividing the resin package part.

CITATION LIST

Patent Literature

Patent Literature 1: Japanese Unexamined patent Publication No. 2008-153710

SUMMARY OF INVENTION

Technical Problem

In the electronic component described in Patent Literature 1, the width of the leads exposed from the side surface of the resin package is equal to the thickness of the lead frame, which is relatively large. Accordingly, when the electronic component is mounted on a circuit board by reflow, a mounting error such as a bridging phenomenon or a chip standing phenomenon may be caused. This is remarkable as the electronic component decreases in size to decrease a distance between the leads. Recently, an increase in density of electronic components has been requested, but because a substrate part of the electronic component described in Patent Literature 1 has a single layer, it is difficult to achieve an increase in density. Because the electronic component is produced by cutting out the resin package part from the lead frame, it is difficult to efficiently produce a plurality of electronic components.

An aspect of the present invention is made in consideration of the aforementioned circumstances and an object thereof is to provide a method of producing electronic components that can achieve an increase in density and an improvement in production efficiency and prevent occurrence of a mounting error.

Solution to Problem

According to an aspect of the present invention, there is provided a method of producing electronic components for acquiring a plurality of electronic components by cutting, along a predetermined cutting line, a laminate including a first circuit board and a second circuit board both mounted with circuit components, the method comprising: a stacking step of stacking the second circuit board on the first circuit board with a spacer interposed therebetween, the first circuit board being provided with a filled via around a mounting region of the circuit components; a filling step of filling a filling space formed between the first circuit board and the second circuit board using the spacer with an insulating resin; and a cutting step of cutting the laminate along the cutting line, the cutting line dividing the filled via, and exposing the filled via from a cut surface to acquire terminal portions of the electronic components.

According to the method of producing electronic components, because an electronic component in which the first circuit board and the second circuit board both mounted with circuit components can be produced, it is possible to reduce a mounting area and to achieve a decrease in size and an increase in density. Because a plurality of electronic components are obtained from a single laminate by cutting the laminate along the predetermined cut line, it is possible to achieve an improvement in production efficiency. Because the terminal portions are formed by dividing the filled vias, the width of the terminal portions exposed from the side surface of the electronic component can be set to be smaller than that when a lead frame is cut to form the terminal portions. Accordingly, even when an electronic component is decreased in size, it is possible to prevent occurrence of a mounting error.

The filling space formed between the first circuit board and the second circuit board may include a first filling space formed inside the mounting region. In this case, the circuit components mounted on the first circuit board can be protected from heat using the resin filled in the first filling space. Accordingly, it is possible to obtain an electronic component which is reflow-mountable.

The filling space formed between the first circuit board and the second circuit board may further include a second filling space formed outside the mounting region and communicating with the first filling space. In this case, because the filling spaces can be filled with the resin from the second filling space in addition to the first filling space, it is possible to enable the resin to easily diffuse into the whole filling spaces.

The stacking step may include stacking a third circuit board on the second circuit board with a spacer interposed therebetween, and the filling step may include filling a filling space formed between the second circuit board and the third circuit board using the spacer with an insulating resin. In this case, for example, by mounting circuit components on the third circuit board, it is possible to achieve a further increase in density. Alternatively, for example, the third circuit board can be used as a top cover.

The filling space formed between the first circuit board and the second circuit board may include a first filling space formed inside the mounting region and a second filling space formed outside the mounting region and communicating with the first filling space, the filling space formed between the second circuit board and the third circuit board may include a third filling space formed outside the mounting region, and the second circuit board may include a communication hole letting the second filling space and the third filling space to communicate with each other. In this case, because the filling spaces can also be filled with the resin from the third filling space, it is possible to enable the resin to easily diffuse into the whole filling spaces. Because the second filling space and the third filling space communicate with each other, it is possible to enable the resin to easily diffuse into the whole filling spaces.

Advantageous Effects of Invention

According to the aspect of the present invention, it is possible to provide a method of producing electronic components that can achieve an increase in density and an improvement in production efficiency and prevent occurrence of a mounting error.

DESCRIPTION OF EMBODIMENTS

Hereinafter, embodiments of the present invention will be described in detail with reference to the accompanying drawings. In the following description, identical or corresponding elements will be referenced by identical reference signs and repeated description thereof will not be made.

Figure 1:
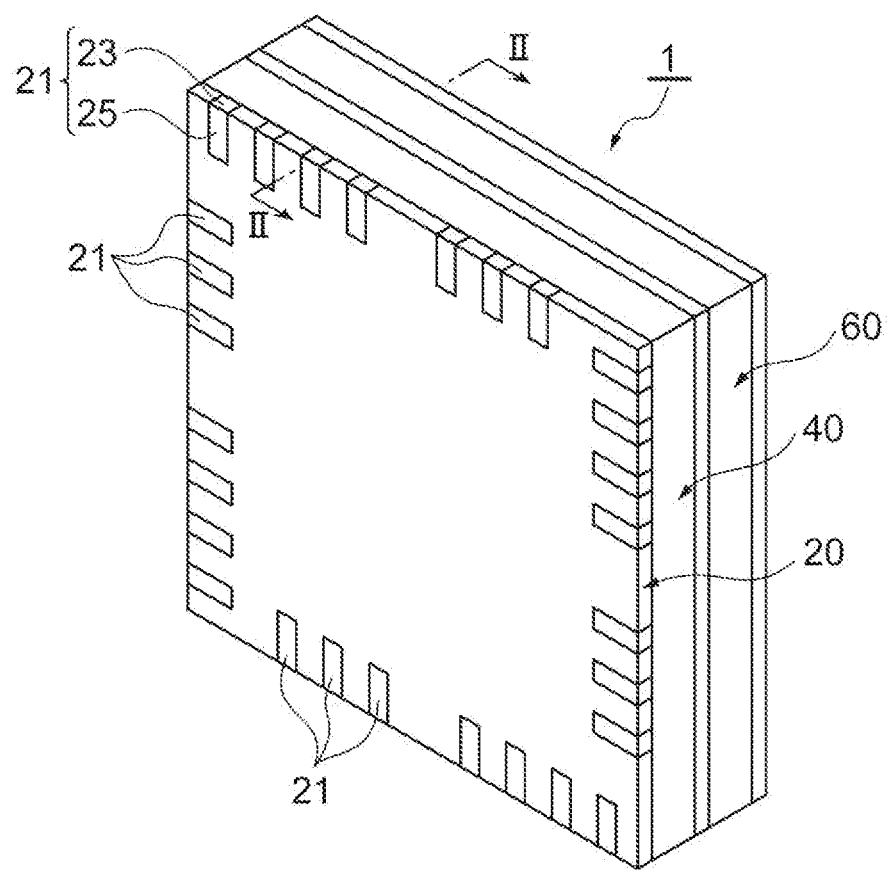
FIG. 1 is a perspective view of an electronic component according to an embodiment of the present invention when viewed from a bottom side.
Figure 2:
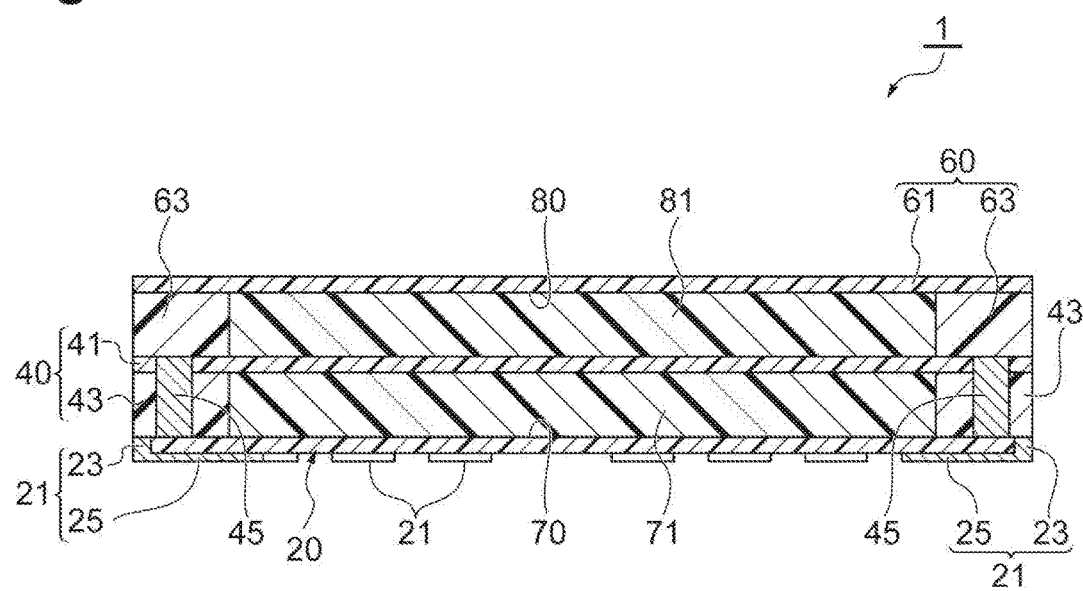
FIG. 2 is a cross-sectional view taken along line in FIG. 1.

FIG. 1 is a perspective view of an electronic component according to an embodiment of the present invention when viewed from a bottom side. FIG. 2 is a cross-sectional view taken along line II-II in FIG. 1. An electronic component 1 according to this embodiment is, for example, a surface-mounting electronic component, is mounted on a circuit board which is not illustrated, and serves as, for example, a high-voltage power source.

The electronic component 1 has, for example, a substantially rectangular parallelepiped shape and the bottom surface of the electronic component 1 has, for example, a square shape with a side length of 10 mm. The electronic component 1 has a configuration in which a base board 20 (a first circuit board) and a stacked board 40 (a second circuit board) on which circuit components are mounted and a top cover board 60 (a third circuit board) serving as a top cover are stacked. These boards are stacked in the order of the base board 20, the stacked board 40, and the top cover board 60 from the bottom surface of the electronic component 1, and gaps between the boards are filled with insulating resins 71 and 81 as will be described later. The main surfaces of the base board 20, the stacked board 40, and the top cover board 60 have the same planar shape. Any circuit boards can be employed as the base board 20, the stacked board 40, and the top cover board 60, and for example, a glass epoxy board can be employed.

The base board 20 is a circuit board having a square plate shape, and a plurality of circuit components 5 (see FIG. 3(c)) to be described later) are mounted on a front surface (a surface on the stacked board 40 side) of the base board 20. The plurality of circuit component 5 are any circuit elements which are required for realizing the functions of the electronic component 1, may be different from each other, and are, for example, semiconductor elements. The base board 20 includes a plurality of terminal portions 21 which are exposed from four sides of the rear surface thereof, as illustrated in FIG. 1. For example, in this embodiment, seven terminal portions 21 are arranged in a line at a predetermined interval on each side. The terminal portion 21 is formed of a conductive metal, for example, copper. It is preferable that the thickness of the base board 20 be as small as possible for the purpose of achieving a decrease in thickness of the electronic component 1. The decrease in thickness of the base board 20 is preferable from the viewpoint of relaxing a stress acting on the base board 20 and from the viewpoint of facilitating a cutting step (dicing) to be described later.

As illustrated in FIG. 2, each terminal portion 21 includes a body portion 23 that extends from the front surface of the base board 20 to the rear surface and a land portion 25 that is formed integrally with the body portion 23 to extend along the rear surface of the base board 20. The width of the terminal portion 21 is, for example, 0.1 mm. The right and left side surfaces (outer surfaces) of the body portion 23 are located on the same planes of the right and left side surfaces (outer surfaces) of the electronic component 1 (the stacked board 40 and the top cover board 60) and are flush therewith. The body portion 23 is electrically connected to circuit patterns 27 (see FIG. 3(a) to be described later) which are disposed on the front surface of the base board 20. The land portion 25 has a rectangular shape extending from the edge of the base board 20 to the center thereof and serves as a terminal when the electronic component 1 is mounted on the circuit board. The bottom shape of the electronic component 1, the pitch interval of the terminal portions 21, and the shape of the land portions 25 have only to be pursuant to, for example, a QFN standard, and can be changed.

As illustrated in FIG. 2, the stacked board 40 includes a stacked board body 41 having a square plate shape in which a plurality of circuit components 7 (see FIG. 4(c) to be described later) are mounted on a front surface thereof (a surface on the top cover board 60 side) and stepped portions 43 (spacers) that are formed integrally with the stacked board body 41 to protrude to the rear surface side of the stacked board body 41. The plurality of circuit components 7 are any circuit elements required for realizing the functions of the electronic component 1, may be different from each other, and are, for example, semiconductor elements. The stepped portions 43 are formed of, for example, prepreg and are disposed around circuit components 7 as will be described later with reference to FIGS. 4(a) and 4(b). The stacked board 40 is stacked on the base board 20 with the stepped portions 43 interposed therebetween. By stacking the stacked board 40 on the base board 20 with the stepped portions 43 interposed therebetween, a lower filling space 70 is formed between the base board 20 and the stacked board 40.

The lower filling space 70 is filled with an insulating resin 71. The circuit components 5 mounted on the base board 20 are covered with the resin 71. As the resin 71, a resin close in physical properties to the resin constituting the base board 20, the stacked board 40, and the top cover board 60 can be preferably used, and an epoxy resin can be preferably used, for example, when the boards are formed of a glass epoxy board.

A plurality of filled vias 45 penetrating the stacked board body 41 and the stepped portions 43 are formed in the stacked board 40. Each filled via 45 is a via of which a through-hole is filled with a conductive metal by plating, and a through-hole having a substantially circular cross-section is filled with copper by plating herein. The filled vias 45 are electrically connected to circuit patterns 27 formed on the front surface of the base board 20 and circuit patterns 47 formed on the front surface of the stacked board 40 (see FIG. 4(*a*) to be described later). As will be described later with reference to FIGS. 4(*a*) and 4(*b*), the filled vias 45 are arranged around circuit components 7 mounted on the front surface of the stacked board 40.

As illustrated in FIG. 2, the top cover board 60 includes a top cover board body 61 having a square plate shape and stepped portions 63 (spacers) that are formed integrally with the top cover board body 61 to protrude to the rear surface side of the top cover board body 61. No circuit pattern is formed on the front surface of the top cover board 60 (the top cover board body 61). The stepped portions 63 are formed of, for example, prepreg. The top cover board 60 is stacked on the stacked board 40 with the stepped portions 63 interposed therebetween. By stacking the top cover board 60 on the stacked board 40 with the stepped portions 63 interposed therebetween, an upper filling space 80 is formed between the stacked board 40 and the top cover board 60. The upper filling space 80 communicates with the lower filling space 70 as will be described later, and is filled with the resin 81 similar to the lower filling space 70. The circuit components 7 mounted on the stacked board 40 are covered with the resin 81. The resin 81 is formed integrally with the resin 71 as will be described later, and is formed of the same resin material as the resin 71.

Subsequently, a method of producing the electronic components 1 will be described with reference to FIGS. 3 to 7. In the method of producing the electronic components 1 according to this embodiment, approximately, a laminate 10 which is obtained by stacking the base board 20, the stacked board 40, and the top cover board 60 is cut along predetermined cutting lines L, and a plurality of electronic components 1 (for example, eight electronic components in this embodiment) are obtained from a single laminate 10. Now, a base board preparing step of preparing the base board 20 (FIG. 3), a stacked board preparing step of preparing the stacked board 40 (FIG. 4), and a top cover board preparing step of preparing the top cover board 60 (FIG. 5) will be described. Then, a stacking step of forming the lower filling space 70 and the upper filling space 80 by stacking these boards (FIG. 6(*a*)), a filling step of filling the lower filling space 70 and the upper filling space 80 with the resins 71 and 81 (FIG. 6(*b*)), and a cutting step of cutting the laminate 10 along the cutting lines L (FIGS. 6(*c*) and 7) will be described.

Figure 3:
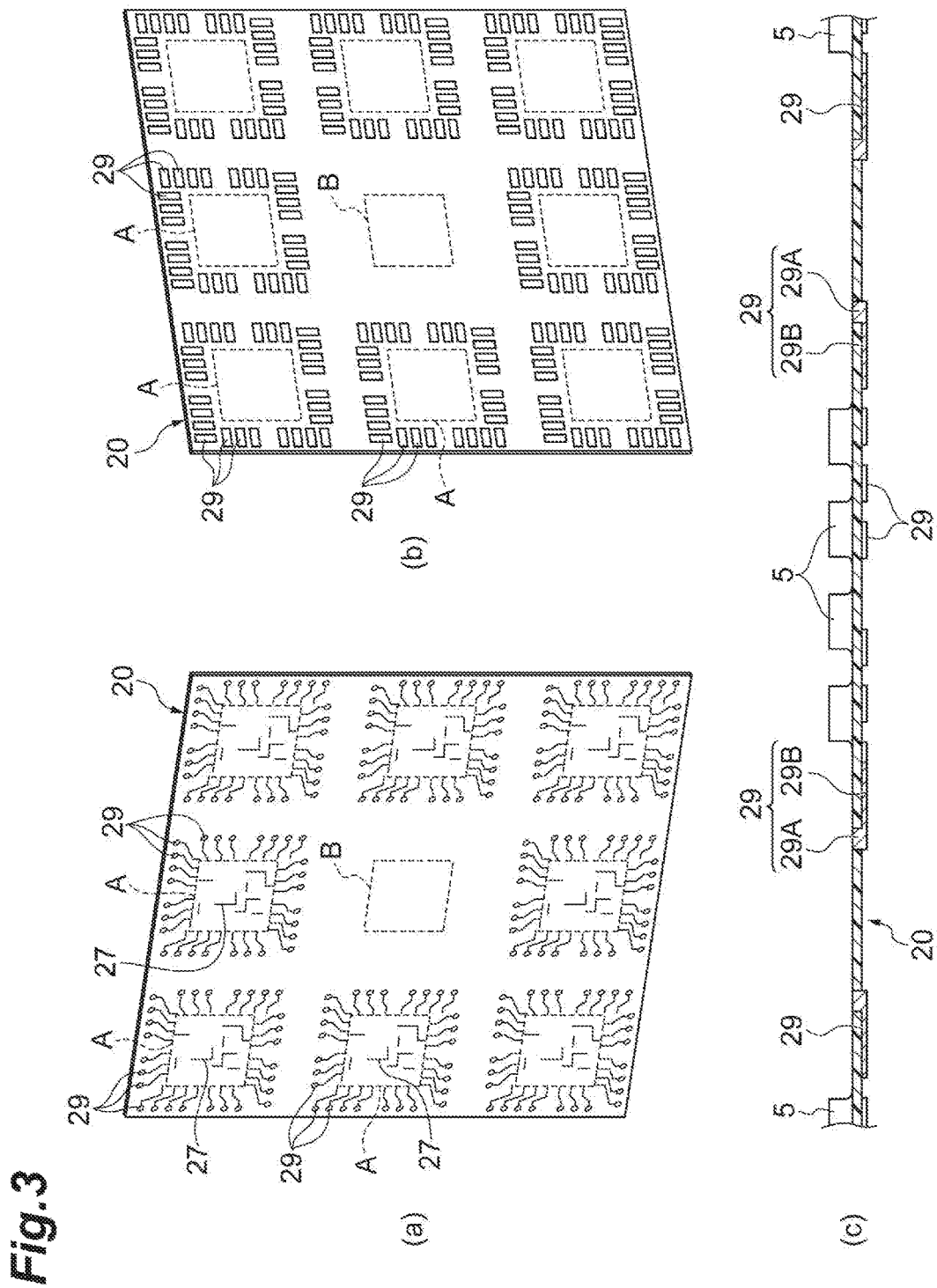
FIG. 3(a) is a perspective view of a base board when viewed from a front side.
FIG. 3(b) is a perspective view of the base board when viewed from a rear side.
FIG. 3(c) is a cross-sectional view illustrating the base board after circuit components are mounted thereon.

The base board preparing step will be described below with reference to FIG. 3. As illustrated in FIG. 3(*a*), eight rectangular mounting regions A are set on the base board 20. The mounting regions A have the same shape and are arranged in a lattice shape at constant intervals in three rows and three columns except for central portions B having the same shape. The circuit pattern 27 on which the circuit components 5 are mounted is formed on the surface of each mounting region A.

In the base board preparing step, filled vias 29 are formed around each mounting region A as illustrated in FIGS. 3(*b*) and 3(*c*). Each filled via 29 is a via of which a through-hole is filled with a conductive metal by plating and, for example, a through-hole having a substantially circular cross-sectional shape is filled by copper by plating. The filled via 29 is a portion which is divided in the cutting step to be described later to serve as the terminal portion 21.

In this embodiment, when the filled vias 29 are formed, the through-holes are filled with copper by plating and portions serving as the land portions 25 are also simultaneously formed by copper plating. That is, each filled via 29 has a first portion 29A of which the through-hole is filled with copper by plating and a second portion 29B which is formed integrally with the first portion 29A and which has a rectangular shape extending to the center of the mounting region A. The diameter of the first portion 29A is set to, for example, 0.1 mm.

When the filled vias 29 are formed, through-holes having a substantially circular cross-sectional shape are formed to be arranged on the cutting lines L (see FIG. 7) serving as cutting lines in the cutting step to be described later, and the through-holes are filled with copper by plating to form the filled vias 29. Specifically, as described above, seven filled vias 29 are formed to be arranged in a line at predetermined intervals along four sides of the mounting region A. The formed filled vias 29 are electrically connected to the circuit pattern 27.

In the base board preparing step, the circuit components 5 are mounted on the circuit pattern 27 of each mounting region A. For example, a solder paste may be formed on the circuit pattern 27 and the circuit component may be mounted thereon by reflow. Thereafter, a resin layer (an intersection-coating resin) is formed in the mounting portion. The resin layer is formed of, for example, silicone rubber. By forming the resin layer, it is possible to prevent the circuit component 5 from moving in the stacking step to be described later. The resin layer serves as a stress relaxing layer for relaxing a stress acting on the circuit component 5 after the lower filling space 70 and the upper filling space 80 are filled with the resins 71 and 81 in the filling step. After the resin layer is formed, void release is performed, for example, by vacuum defoaming so as for voids not to remain in the resin layer.

Figure 4:
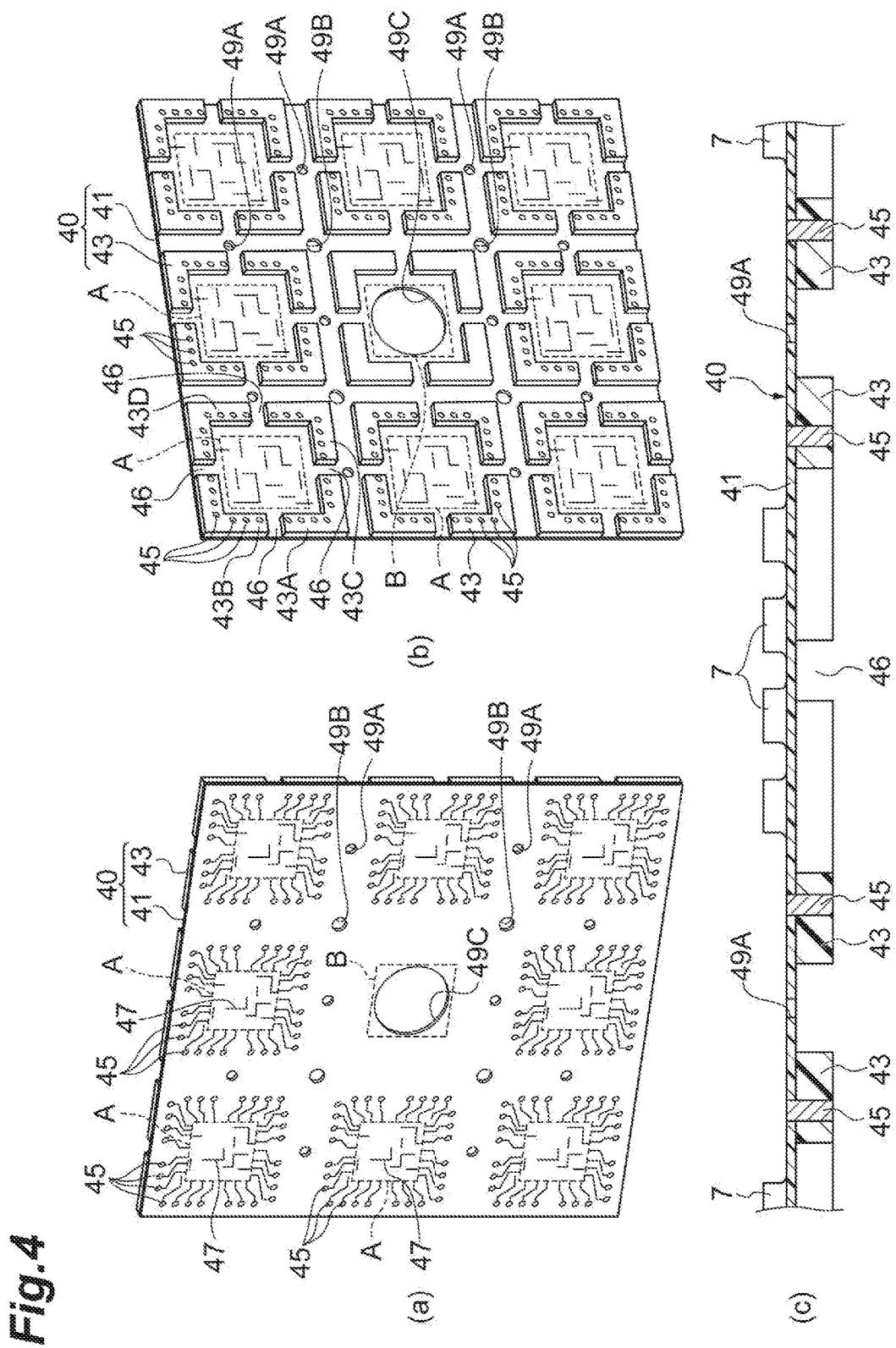
FIG. 4(a) is a perspective view of a stacked board when viewed from a front side.
FIG. 4(b) is a perspective view of the stacked board when viewed from a rear side.
FIG. 4(c) is a cross-sectional view illustrating the stacked board after circuit components are mounted thereon.

The stacked board preparing step will be described below with reference to FIG. 4. The stacked board body 41 has the same planar shape as the base board 20, and eight rectangular mounting regions A are set on the stacked board body 41, for example, in the same arrangement as the base board 20 as illustrated in FIG. 4(*a*). The circuit pattern 47 on which the circuit components 7 are mounted is formed on the surface of each mounting region A.

In the stacked board preparing step, the stepped portions 43 are formed on the rear surface of the stacked board body 41 to surround each mounting region A, as illustrated in FIGS. 4(*b*) and 4(*c*). Specifically, a first stepped portion 43A, a second stepped portion 43B, a third stepped portion 43C, and a fourth stepped portion 43D are arranged, for example, at four corners of the mounting region A as illustrated in FIG. 4(*b*). The stepped portions 43A to 43D have an L shape or shapes which are obtained by inverting the L shape vertically or horizontally or in both manners, and a gap 46 is formed between neighboring stepped portions 43A to 43D. The gap 46 serves as an injection port for injecting the resins 71 and 81 or a passage port through which the resins 71 and 81 pass in the filling step to be described later.

In the stacked board preparing step, a plurality of communication holes 49 are formed in the stacked board body 41 as illustrated in FIG. 4. Each communication hole 49 is, for example, a circular hole and is formed outside the mounting regions A. The communication holes 49 include, for example, a communication hole 49A having the smallest diameter, a communication hole 49B having a diameter larger than that of the communication hole 49A, and a communication hole 49C having a diameter larger than that of the communication hole 49B, that is, include three types of holes having different opening areas. The communication holes 49A are arranged, for example, between the gaps 46 of the neighboring mounting regions A. The communication holes 49B are arranged, for example, between the mounting regions A at four corners of the stacked board body 41 and the central portion B. The communication hole 49C is arranged, for example, in the central portion B.

In the stacked board preparing step, a plurality of filled vias 45 penetrating the stacked board body 41 and the stepped portions 43 are formed. Specifically, for example, seven filled vias 45 are formed to be arranged in a line at predetermined intervals along four sides of the mounting region A.

In the stacked board preparing step, the circuit components 7 are mounted on the circuit pattern 47 of each mounting region A. For example, a solder paste may be formed on the circuit pattern 47 and the circuit components may be mounted thereon by reflow. Thereafter, a resin layer is formed in the mounting portion. The resin layer is formed of, for example, silicon rubber. By forming the resin layer, it is possible to prevent the circuit component 7 from moving in the stacking step to be described later. The resin layer serves as a stress relaxing layer for relaxing a stress acting on the circuit component 7 after the lower filling space 70 and the upper filling space 80 are filled with the resins 71 and 81 in the filling step. After the resin layer is formed, void release is performed, for example, by vacuum defoaming so as for voids not to remain in the resin layer.

Figure 5:
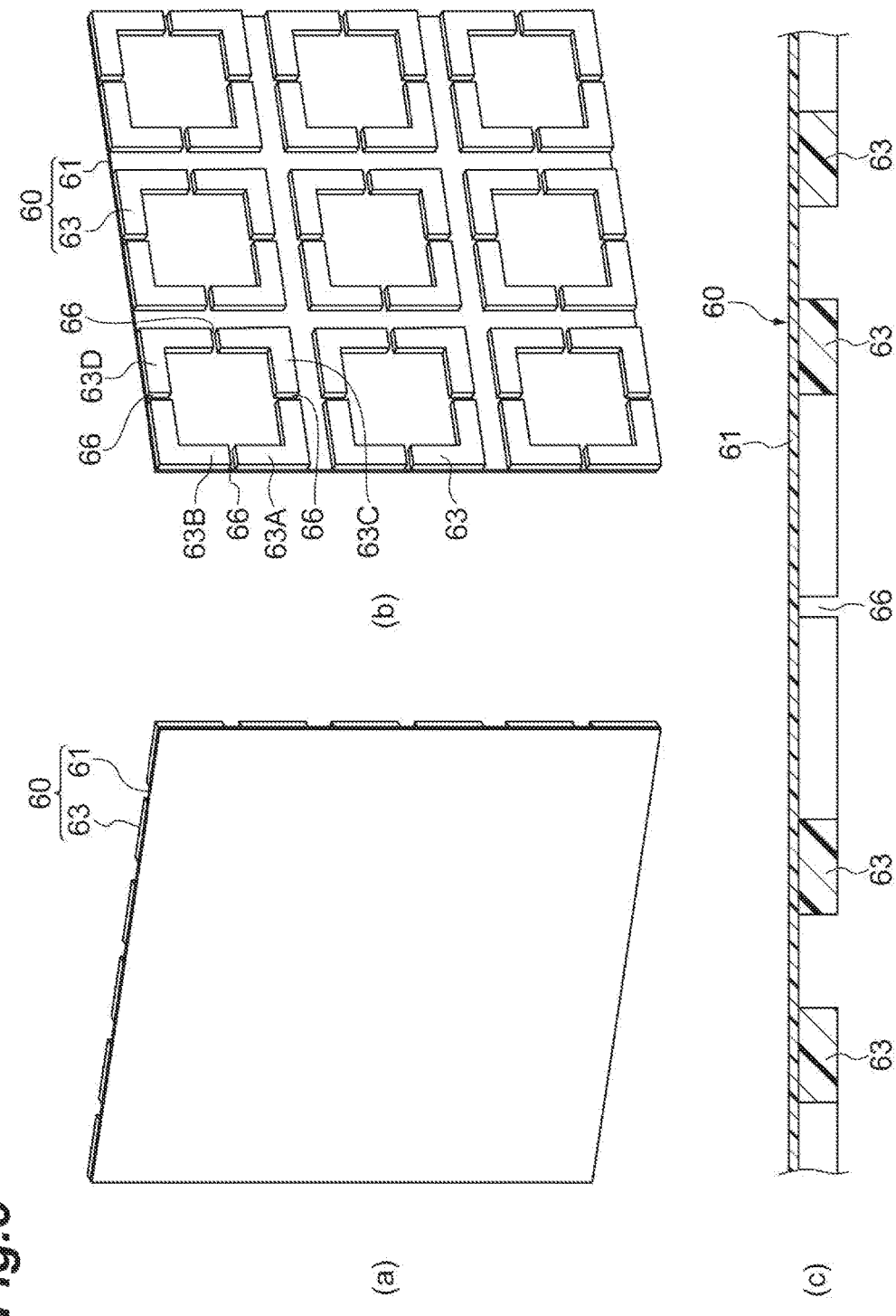
FIG. 5(a) is a perspective view of a top cover board when viewed from a front side.
FIG. 5(b) is a perspective view of the top cover board when viewed from a rear side.
FIG. 5(c) is a cross-sectional view illustrating the top cover board.

The top cover board preparing step will be described below with reference to FIG. 5. The top cover board body 61 has the same planar shape as the base board 20 and the stacked board 40. In the top cover board preparing step, the stepped portions 63 are formed on the rear surface of the top cover board body 61 to surround the region corresponding to each mounting region A, as illustrated in FIGS. 5(*b*) and 5(*c*). Specifically, a first stepped portion 63A, a second stepped portion 63B, a third stepped portion 63C, and a fourth stepped portion 63D are arranged, for example, at four corners of the mounting region A as illustrated in FIG. 5(*b*). The stepped portions 63A to 63D have an L shape or shapes which are obtained by inverting the L shape vertically or horizontally or in both manners, and a gap 66 is faulted between neighboring stepped portions 63A to 63D. The gap 66 is formed to be narrower than the above-mentioned gap 46. The gap 66 serves as an injection port for injecting the resins 71 and 81 or a passage port through which the resins 71 and 81 pass in the filling step to be described later.

Subsequently, the stacking step, the filling step, and the cutting step will be described below with reference to FIG. 6.

Figure 6:
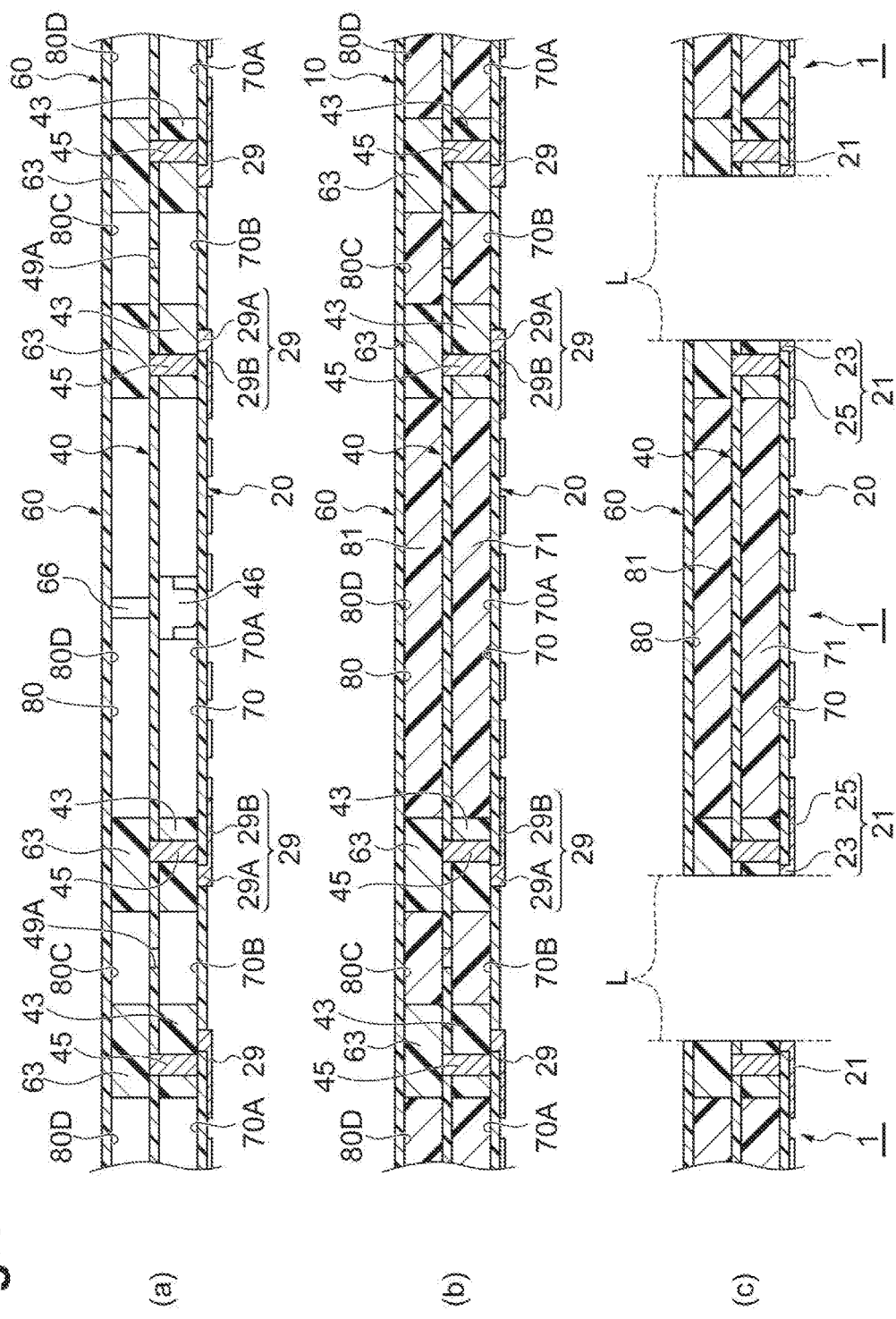
FIG. 6(a) is a cross-sectional view illustrating a stacking step.
FIG. 6(b) is a cross-sectional view illustrating a filling step.
FIG. 6(c) is a cross-sectional view illustrating a cutting step.

In the stacking step, the stacked board 40 is stacked on the base board 20 with the stepped portions 43 interposed therebetween as illustrated in FIG. 6(*a*). For example, a solder paste is formed on the circuit patterns 27 of the base board 20 and the circuit patterns 27 of the base board 20 and the filled vias 45 of the stacked board 40 are connected by reflow. The top cover board body 61 is stacked on the stacked board 40 with the stepped portions 63 interposed therebetween. For example, a solder paste is formed on the circuit patterns 47 of the stacked board 40 and the circuit patterns 47 of the stacked board 40 are connected to stack-fixing patterns formed on the bottom surface of the top cover board 60 by reflow. Accordingly, the boards which are disposed vertically are stacked each other to form the laminate 10. At this time, the lower filling space 70 is formed between the base board 20 and the stacked board 40, and the upper filling space 80 is formed between the stacked board 40 and the top cover board 60.

The lower filling space 70 includes a first filling space 70A which is formed inside each mounting region A and a second filling space 70B which is formed outside each mounting region A. The first filling space 70A and the second filling space 70B communicate with each other via the aforementioned gap 46. The first filling space 70A and the second filling space 70B communicate with the outside of the laminate 10 via the gaps 46.

The upper filling space 80 includes a third filling space 80C which is formed outside each mounting region A and a fourth filling space 80D which is formed inside each mounting region A. The third filling space 80C and the fourth filling space 80D communicate with each other via the aforementioned gap 66. The third filling space 80C and the fourth filling space 80D communicate with the outside of the laminate 10 via the gaps 66. The third filling space 80C communicates with the second filling space 70B via the communication holes 49 (the communication holes 49A to 49C).

In the filling step, the lower filling space 70 and the upper filling space 80 are filled with the resins 71 and 81 as illustrated in FIG. 6(*b*). The filling with the resins is performed, for example, using vacuum filling equipment. At this time, the inside of the laminate 10 is filled with the resins 71 and 81 from the first filling space 70A (the gap 46), the second filling space 70B, the third filling space 80C (the gap 66), and the fourth filling space 80D. The resins 71 and 81 which have been injected into the laminate 10 pass through the gaps 46, the gaps 66, and the communication holes 49A to 49C and diffuse widely in the lower filling space 70 and the upper filling space 80. Accordingly, the lower filling space 70 and the upper filling space 80 are filled with the resins 71 and 81 which are formed integrally with each other.

In this embodiment, because the communication holes 49A are formed between the gaps 46, the communication holes 49B having a diameter larger than that of the communication holes 49A are formed between the mounting regions A at four corners and the central portion B, and the communication hole 49C having a diameter larger than that of the communication holes 49B is formed in the central portion B, the resins 71 and 81 can diffuse widely in the lower filling space 70 and the upper filling space 80 as a whole. Accordingly, it is possible to prevent voids (bubbles) from remaining in the resins 71 and 81 which have been injected into the lower filling space 70 and the upper filling space 80 and solidified, and it is possible to prevent the resins 71 and 81 from being damaged by heat generated at the time of mounting the electronic component 1 by reflow.

Figure 7:
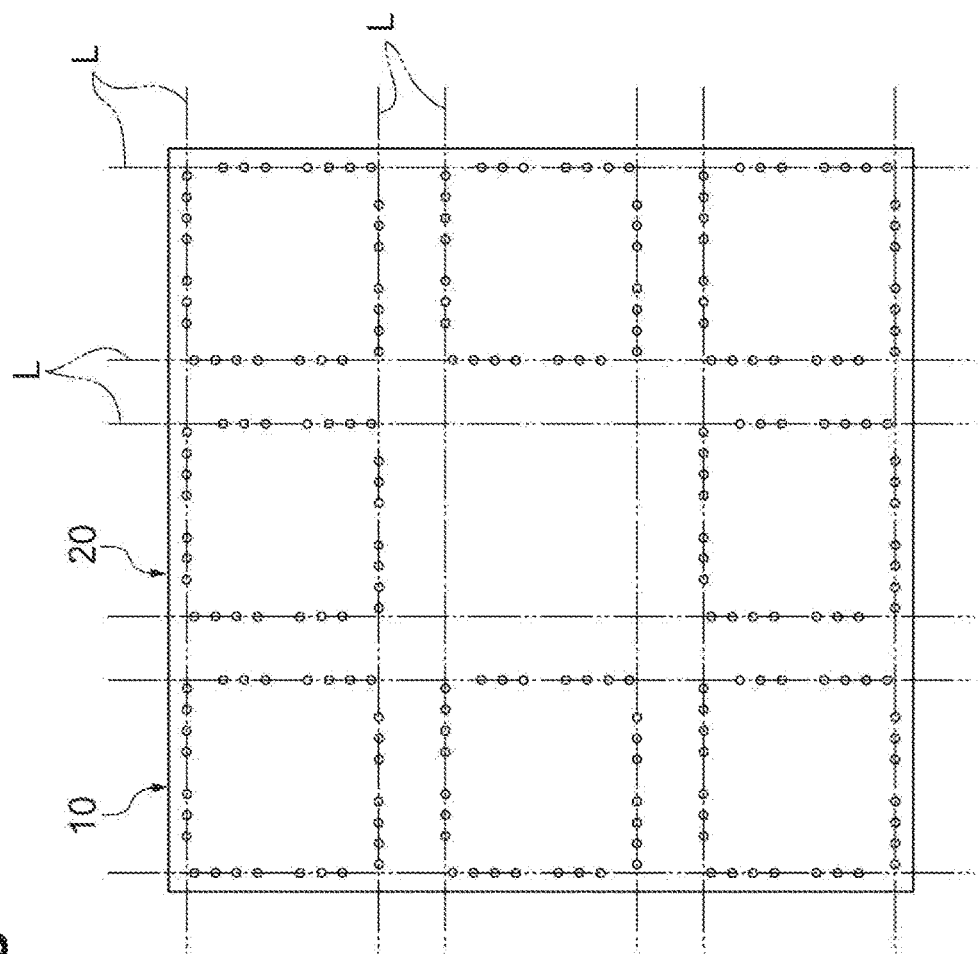
FIG. 7 is a diagram illustrating cutting lines in the cutting step when a laminate is viewed from a rear side.

In the cutting step, as illustrated in FIGS. 6(C) and 7, the laminate 10 is cut along predetermined cutting lines L to obtain a plurality of electronic components 1 (eight electronic components in this embodiment) from the single laminate 10. The cutting lines L are set to positions at which the filled vias 29 of the base board 20 are divided. For example, in this embodiment, each cutting line L is a straight line passing through the center point of the first portion 29A of each filled via 29, and the filled via 29 is cut such that the first portion 29A is divided into halves. Accordingly, it is possible to expose the filled vias 29 from the cut surface to form the aforementioned terminal portions 21.

The cutting of the laminate 10 is performed, for example, by dicing using a blade. By cutting out the products individualized from the laminate 10 in the cutting step, a plurality of electronic components 1 can be obtained from the single laminate 10. While eight electronic components 1 are obtained from a single laminate 10 in this embodiment, the number of electronic components 1 obtained from a single laminate 10 is not particularly limited. For example, by increasing the size of the laminate 10, more electronic components 1 may be obtained. Inspection of conduction states or the like may be performed before the laminate 10 is cut in the cutting step. In this case, because the plurality of electronic components 1 which will be cut off from the laminate 10 can be inspected in a lump, it is possible to improve production efficiency. The inspection may be performed after the cutting step.

According to the above-mentioned method of producing electronic components, because the electronic component 1 in which the base board 20 and the stacked board 40 both mounted with the circuit components 5 and 7 can be produced, it is possible to decrease the mounting area to achieve a decrease in size and an increase in density. Because a plurality of electronic components 1 can be obtained from a single laminate 10 by cutting the laminate 10 along the predetermined cutting lines L, it is possible to achieve an improvement in production efficiency (to enable batch production).

Because the terminal portions 21 are formed by dividing the filled vias 29, the width of the terminal portions 21 which are exposed from the side surfaces of the electronic component 1 can be made to be smaller than that in a case in which the terminal portions are formed by cutting lead frames. For example, when the terminal portions are formed by cutting lead frames, the terminal width is normally about 0.3 mm. On the other hand, the diameter of the first portion 29A of each filled via 29 can be set to be about 0.1 mm, and the terminal width is about 0.1 mm when the filled via is divided into halves to form the terminal portion 21. Accordingly, even when the size of the electronic component 1 is decreased, it is possible to prevent occurrence of a mounting error. According to the above-mentioned method of producing an electronic component, it is possible to obtain an electronic component 1 which has a bottom shape and a terminal arrangement based on the QFN standard and which has an increased density.

According to the method of producing electronic components, it is possible to protect the circuit components 5 mounted on the base board 20 from heat by the resin 71 filled in the first filling space 70A. It is also possible to protect the circuit components 7 mounted on the stacked board 40 from heat by the resin 81 filled in the fourth filling space 80D. Accordingly, because an influence of heat to the circuit components 5 and 7 is suppressed at the time of reflow mounting of the circuit components of the electronic component 1, it is possible to obtain an electronic component 1 which is reflow-mountable. Because the electronic component 1 is formed in a terminal arrangement based on the standard and is reflow-mountable, it is possible to mount the electronic component using an automatic machine.

According to the method of producing an electronic component, because the filling space can be filled with the resin from the second filling space 70B in addition to the first filling space 70A, it is possible to enable the resin to easily diffuse widely in the filling space as a whole. According to the method of producing an electronic component, because the filling space can be filled with the resin from the third filling space 80C and the fourth filling space 80D, it is possible to enable the resin to easily diffuse widely in the filling space as a whole. Because the second filling space 70B and the third filling space 80C communicate with each other, it is possible to enable the resin to easily diffuse more widely in the filling space as a whole.

While exemplary embodiments of the present invention have been described above, the present invention is not limited to the embodiments, but may be modified without changing the gist of the appended claims or may be applied to other applications.

For example, in the above-mentioned embodiments, the third circuit board is used as the top cover board 60 serving as a top cover, but may be used as a circuit board on which circuit components are mounted. By further stacking a circuit board on which circuit components are mounted, it is possible to achieve a further increase in density. In this way, the number of boards to be stacked is not limited, and circuit boards on which circuit components are mounted such as a fourth circuit board and a fifth circuit board may be further stacked. In this case, the uppermost circuit board may be used as the top cover board as in this embodiment, and when the top cover is formed of a filled resin, the top cover board may not be necessary.

In the above-mentioned embodiment, each land portion 25 is formed in a shape extending from edges of the base board 20 to the center thereof, but the land portion 25 may have any shapes. For example, the land portion 25 may have a shape in which pin grid array (PGA) terminals are formed to protrude at the center of the land portion. In this case, because the number of terminal pins can be increased, it is possible to improve versatility of the electronic component. In this case, filled vias 29 having a shape corresponding to the terminal shape may be formed in the base board preparing step.

The production process described in the above-mentioned embodiment is merely an example, and the order of steps may be appropriately changed. For example, the order of performing the base board preparing step, the stacked board preparing step, and the top cover board preparing step is not limited, and these steps may be performed simultaneously. In the base board preparing step, any one of formation of the filled vias 29 and mounting of the circuit components 5 may be first performed and both processes may be simultaneously performed. Similarly, in the stacked board preparing step, the order of performing formation of the stepped portions 43, formation of the communication holes 49, formation of the filled vias 45, and mounting of the circuit components 7 is not limited and these processes may be simultaneously performed.

Some of the production steps described above in the above-mentioned embodiment may be skipped. For example, in the base board preparing step, so long as the base board 20 in which the filled vias 29 are formed and the circuit components 5 are mounted can be obtained, a processed base board 20 on which at least a part of the steps has been performed in other places may be used. Similarly, in the stacked board preparing step, so long as the stacked board 40 in which the stepped portions 43, the communication holes 49, and the filled vias 45 are formed and the circuit components 7 are mounted can be obtained, a processed stacked board 40 on which at least a part of the steps have been performed in other places may be used. Similarly, in the top cover board preparing step, so long as the top cover board 60 in which the stepped portions 63 are formed can be obtained, a processed top cover board 60 on which at least a part of the steps has been performed in other places may be used.

In the above-mentioned embodiment, the stepped portions 43 as the spacers are formed integrally with the stacked board body 41, but the spacers (the stepped portions 43) may be formed separate from the stacked board 40. In this case, by inserting the spacers between the stacked board 40 and the base board 20 at the time of stacking, the stacked board body 41 is stacked on the base board 20 with the spacers interposed therebetween. This point is true of the top cover board 60.

In the above-mentioned embodiment, communication holes 49A to 49C having different diameters are formed as the communication holes of the stacked board 40, but the positions and the shapes of the communication holes are not limited to the above description, but, for example, the communication holes 49A and 49B may be formed to have the same diameter. When fluidity of the resins 71 and 81 are sufficiently high, the communication holes 49C may not be formed and circuit components 7 may be mounted on the central portion B. That is, the central portion B may be used as a mounting region A. By accurately arranging the communication holes 49B, the communication holes may be used as positioning portions at the time of production (for example, at the time of stacking the boards).

REFERENCE SIGNS LIST

1 . . . electronic component, 5 . . . circuit component, 7 . . . circuit component, 10 . . . laminate, 20 . . . base board (first circuit board), 21 . . . terminal portion, 23 . . . body portion, 25 . . . land portion, 29 . . . filled via, 40 . . . stacked board (second circuit board), 43 . . . stepped portion (spacer), 46 . . . gap, 49 . . . communication hole, 60 . . . top cover board (third circuit board), 63 . . . stepped portion (spacer), 66 . . . gap, 70 . . . lower filling space, 70A . . . first filling space, 70B . . . second filling space, 71 . . . resin, 80 . . . upper filling space, 80C . . . third filling space, 80D . . . fourth filling space, 81 . . . resin, A . . . mounting region, B . . . central portion, L . . . cutting line

The invention claimed is:

1. A method of producing electronic components for acquiring a plurality of electronic components by cutting, along a predetermined cutting line, a laminate including a first circuit board and a second circuit board both mounted with circuit components, the method comprising:
   a stacking step of stacking the second circuit board on the first circuit board with a spacer interposed therebetween, the first circuit board being provided with a filled via around a mounting region of the circuit components of the first circuit board thus forming the laminate;
   a filling step of filling a filling space formed between the first circuit board and the second circuit board using the spacer with an insulating resin; and
   a cutting step of cutting the laminate along the cutting line, the cutting line dividing the filled via, and exposing the filled via from a cut surface to acquire terminal portions of the electronic components,
   wherein the filling space formed between the first circuit board and the second circuit board includes a first filling space formed inside the mounting region,
   wherein the filling space formed between the first circuit board and the second circuit board further includes a second filling space formed outside the mounting region and communicating with the first filling space,
   the first filling space and the second filling space are partitioned by the spacer,
   the spacer has a communication opening communicating the first filling space with the second filling space, and the communication opening is filled with the insulating resin in the filling step.

2. The method for producing electronic components according to claim 1, wherein the stacking step includes stacking a third circuit board on the second circuit board with a second spacer interposed therebetween, and
   the filling step includes filling a different filling space formed between the second circuit board and the third circuit board using the second spacer with an insulating resin.

3. The method for producing electronic components according to claim 2, wherein the filling space formed between the first circuit board and the second circuit board includes the first filling space formed inside the mounting region and the second filling space formed outside the mounting region and communicating with the first filling space,
   the different filling space formed between the second circuit board and the third circuit board includes a third filling space formed outside the mounting region, and
   the second circuit board includes a communication hole letting the second filling space and the third filling space to communicate with each other,
   wherein the communication hole is filled with the insulating resin in the filling step.

4. The method for producing electronic components according to claim 1, wherein the insulating resin in the communication opening is cut in the cutting step and exposed from the cut surface so that the cutting line divides the communication opening.

5. The method for producing electronic components according to claim 1, wherein at least a part of the insulating resin filled in the second filling space is removed when cutting the laminate along the cutting line in the cutting step.

* * * * *